(12) United States Patent
Khine et al.

(10) Patent No.: US 9,625,819 B2
(45) Date of Patent: Apr. 18, 2017

(54) PHOTOLITHOGRAPHY ON SHRINK FILM

(75) Inventors: Michelle Khine, Irvine, CA (US); Shreshta Jayadev, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 1003 days.

(21) Appl. No.: 13/481,653

(22) Filed: May 25, 2012

(65) Prior Publication Data

US 2013/0101795 A1    Apr. 25, 2013

Related U.S. Application Data

(60) Provisional application No. 61/491,127, filed on May 27, 2011.

(51) Int. Cl.
| G01B 11/04 | (2006.01) |
| G03F 7/20 | (2006.01) |
| G03F 7/00 | (2006.01) |

(52) U.S. Cl.
CPC .............. *G03F 7/20* (2013.01); *G03F 7/0005* (2013.01); *Y10T 428/24479* (2015.01)

(58) Field of Classification Search
CPC ........ G03F 7/00; G03F 7/0002; G03F 7/0005; G03F 7/20; B29C 33/424; B29C 2033/426; B29C 61/02
See application file for complete search history.

(56) References Cited

U.S. PATENT DOCUMENTS

| 4,247,514 A * | 1/1981 | Luise ............................. 264/345 |
| 4,337,279 A | 6/1982 | Polak |
| 4,470,415 A | 9/1984 | Wozniak |
| 4,596,728 A | 6/1986 | Yang et al. |
| 5,079,273 A | 1/1992 | Kuroda et al. |
| 5,418,136 A | 5/1995 | Miller et al. |
| 5,441,803 A * | 8/1995 | Meissner ....................... 428/220 |
| 6,376,619 B1 | 4/2002 | Halverson et al. |
| 6,395,483 B1 | 5/2002 | Patil et al. |
| 6,482,638 B1 | 11/2002 | Patil et al. |
| 6,548,607 B2 | 4/2003 | Halverson et al. |
| 6,573,338 B2 | 6/2003 | Halverson et al. |
| 6,593,089 B2 | 7/2003 | Patil et al. |

(Continued)

FOREIGN PATENT DOCUMENTS

| WO | WO 2009/064816 A1 | 5/2009 |
| WO | WO 2010/085751 A2 | 7/2010 |

(Continued)

OTHER PUBLICATIONS

Stevens et al., Biomaterials, 2005, Elsevier, 26,7636-7641.*

(Continued)

*Primary Examiner* — Galen Hauth (74) *Attorney, Agent, or Firm* — Foley & Lardner LLP; Antoinette F. Konski; Lydia Choi (57) ABSTRACT

Provided are methods of preparing a plurality of extrusions, comprising (a) shrinking a transparent first thermoplastic material comprising a plurality of non-transparent marks, (b) lithographically transferring the pattern of the shrunk non-transparent marks to a layer of photoresist deposited on a second thermoplastic material, and (c) shrinking the second thermoplastic material, thereby generating a plurality of extrusions on the shrunk second thermoplastic material.

10 Claims, 4 Drawing Sheets

(56) References Cited

U.S. PATENT DOCUMENTS

| | | | |
|---|---|---|---|
| 6,664,060 B2 | 12/2003 | Patil et al. | |
| 6,783,838 B2 | 8/2004 | Coleman et al. | |
| 6,841,258 B2 | 1/2005 | Halverson et al. | |
| 6,881,538 B1 | 4/2005 | Haddad et al. | |
| 6,913,931 B2 | 7/2005 | Halverson et al. | |
| 7,033,667 B2 | 4/2006 | Voss-Kehl et al. | |
| 7,189,842 B2 | 3/2007 | Halverson et al. | |
| 8,828,302 B2 | 9/2014 | Khine et al. | |
| 2002/0146745 A1 | 10/2002 | Natan et al. | |
| 2003/0180191 A1 | 9/2003 | Suzuki et al. | |
| 2004/0092396 A1 | 5/2004 | Glazer et al. | |
| 2005/0083781 A1 | 4/2005 | Caren et al. | |
| 2009/0135582 A1 | 5/2009 | Miller et al. | |
| 2011/0122406 A1 | 5/2011 | Khine et al. | |
| 2012/0027807 A1 | 2/2012 | Chien et al. | |
| 2012/0064627 A1 | 3/2012 | Khine et al. | |
| 2012/0107556 A1 | 5/2012 | Zhang et al. | |
| 2012/0129208 A1 | 5/2012 | Khine et al. | |
| 2012/0129209 A1 | 5/2012 | Khine et al. | |
| 2012/0200008 A1 | 8/2012 | Khine et al. | |
| 2012/0202702 A1 | 8/2012 | Khine et al. | |
| 2013/0040335 A1 | 2/2013 | Khine et al. | |
| 2013/0101795 A1 | 4/2013 | Khine et al. | |
| 2013/0309450 A1 | 11/2013 | Khine et al. | |

FOREIGN PATENT DOCUMENTS

| | | | |
|---|---|---|---|
| WO | WO 2010/108025 A2 | 9/2010 | |
| WO | WO 2010/132610 A2 | 11/2010 | |
| WO | WO 2010/132611 A2 | 11/2010 | |
| WO | WO 2010/132612 A2 | 11/2010 | |
| WO | WO 2011/028579 A2 | 3/2011 | |
| WO | WO 2012/115658 A1 | 8/2012 | |
| WO | WO 2013/063406 A1 | 5/2013 | |

OTHER PUBLICATIONS

Nguyen et al., Lab on a Chip, 2009, RSC Plublishing, 9, 3338-3344.*

Nguyen et al., "Better Shrinkage than Shrinky-Dinks", Lab Chip, Mar. 24, 2010, vol. 10, p. 1623-1626.*

Yokoo et al., "Pattern Size Reduction of Nanoprint-Fabricated Structures on Heat-Shrinkable Film", Sep. 20, 2007, Japanese journal of Applied Physics, vol. 46, No. 9B, p. 6395-6397.*

U.S. Appl. No. 13/367,317, filed Feb. 6, 2012, Khine et al.

U.S. Appl. No. 13/367,320, filed Feb. 6, 2012, Khine et al.

U.S. Appl. No. 13/891,104, filed May 9, 2013, Khine et al.

Au, H.T.H. et al. (2007) "Interactive effects of surface topography and pulsatile electrical field stimulation on orientation and elongation of fibroblasts and cardiomyocytes," Biomaterials 28:4277-4293.

Au, H.T.H. et al. (2009) "Cell culture chips for simultaneous application of topographical and electrical cues enhance phenotype of cardiomyocytes," Lap Chip 9:564-575.

Bettinger, C.J. et al. (2009) "Engineering Substrate Topography at the Micro- and Nanoscale to Control Cell Function," Angew. Chem. Int. Ed. 48:5406-5415.

Bowden, N. et al. (1998) "Spontaneous formation of ordered structures in thin films of metals supported on an elastomeric polymer," Nature 393:146-149.

Chao, S-H. et al. (2007) "Rapid fabrication of microchannels using microscale plasma activated templating (μPLAT) generated water molds," Lab Chip 7:641-643.

Chen, C.S. et al. (1997) "Geometric Control of Cell Life and Death," Science 276:1425-1428.

Chen, A. et al. (2011) "Shrink-Film Configurable Multiscale Wrinkles for Functional Alignment of Human Embryonic Stem Cells and their Cardiac Derivatives," Advanced Materials 23:5785-5791.

Coyne, A.N. et al. (2008) "A Simple Method for Derivatizing the Surface of Silica Gel with Aldehyde Groups by Employing a New Alkoxy Aldehyde Silane," UCT, Inc.:1-15.

Dalby, M.J. et al. (2003) "Nucleus alignment and cell signaling in fibroblasts: response to a microgrooved topography," Experimental Cell Research 284:274-282.

Dalby, M.J. et al. (2007) "Nanomechanotransduction and Interphase Nuclear Organization Influence on Genomic Control," Journal of Cellular Biochemistry 102:1234-1244.

Dalby, M.J. et al. (2007) "The control of human mesenchymal cell differentiation using nanoscale symmetry and disorder," Nature Materials 6:997-1003.

Efimenko, K. et al. (2009) "Development and Testing of Hierarchically Wrinkled Coatings for Marine Antifouling," ACS Applied Materials & Interfaces 1(5):1031-1040.

Engelmayr, G.C. et al. (2008) "Accordion-like honeycombs for tissue engineering of cardiac anisotropy," Nature Materials 7:1003-1010.

Engler, A.J. et al. (2006) "Matrix Elasticity Directs Stem Cell Lineage Specification," Cell 126:677-689.

Fromstein, J.D. et al. (2008) "Seeding Bioreactor-Produced Embryonic Stem Cell-Derived Cardiomyocytes on Different Porous, Degradable Polyurethane Scaffolds Reveals the Effect of Scaffold Architecture on Cell Morphology," Tissue Engineering: Part A 14(3):369-378.

Fu, C-C. et al. (2009) "Tunable Nanowrinkles on Shape Memory Polymer Sheets," Advanced Materials 21:4472-4476.

Gerecht, S. et al. (2007) "The effect of actin disrupting agents on contact guidance of human embryonic stem cells," Biomaterials 28:4068-4077.

Jiang, X. et al. (2002) "Controlling Mammalian Cell Spreading and Cytoskeletal Arrangement with Conveniently Fabricated Continuous Wavy Features on Poly(dimethylsiloxane)," Langmuir 18:3273-3280.

Junkar, I. et al. (2009) "Influence of oxygen and nitrogen plasma treatment on polyethylene terephthalate (PET) polymers," Vacuum 84:83-85.

Kim, D-H. et al. (2010) "Nanoscale cues regulate the structure and function of macroscopic cardiac tissue constructs," PNAS 107(2):565-570.

Laflamme, M.A. et al. (2007) "Cardiomyocytes derived from human embryonic stem cells in pro-survival factors enhance function of infarcted rat hearts," Nature Biotechnology 25(9):1015-1024.

Lam, M.T. et al. (2008) "Reversible on-demand cell alignment using reconfigurable microtopography," Biomaterials 29:1705-1712.

Luna, J.I. et al. (2011) "Multiscale Biomimetic Topography for the Alignment of Neonatal and Embryonic Stem Cell-Derived Heart Cells," Tissue Engineering: Part C 17(5):579-588.

Mandon, C.A. et al. (2010) "Polyshrink™ based microfluidic chips and protein microarrays," Biosensors and Bioelectronics 26:1218-1224.

McBeath, R. et al. (2004) "Cell Shape, Cytoskeletal Tension, and RhoA Regulate Stem Cell Lineage Commitment," Developmental Cell 6:483-495.

McNamara, L.E. et al. (2010) "Nanotopographical Control of Stem Cell Differentiation," Journal of Tissue Engineering:1-13.

Murtuza, B. et al. (2009) "Micro- and Nanoscale Control of the Cardiac Stem Cell Niche for Tissue Fabrication," Tissue Engineering: Part B 15(4):443-454.

Nathan, A.S. et al. (2011) "Mechano-topographic modulation of stem cell nuclear shape on nanofibrous scaffolds," Acta Biomaterialia 7:57-66.

Nguyen, D. et al. (2010) "Better shrinkage than Shrinky-Dinks," Lab Chip 10:1623-1626.

Pagliari, S. et al. (2011) "Cooperation of Biological and Mechanical Signals in Cardiac Progenitor Cell Differentiation," Advanced Materials 23:514-518.

Pajerowski, J.D. et al. (2007) "Physical plasticity of the nucleus in stem cell differentiation," PNAS 104(40):15619-15624.

Pins, G.D. et al. (1997) "Self-Assembly of Collagen Fibers. Influence of Fibrillar Alignment and Decorin on Mechanical Properties," Biophysical Journal 73:2164-2172.

Soliman, S. et al. (2010) "Multiscale three-dimensional scaffolds for soft tissue engineering via multimodal electrospinning," Acta Biomaterialia 6:1227-1237.

(56) References Cited

OTHER PUBLICATIONS

Stevens, K.R. et al. (2009) "Physiological function and transplantation of scaffold-free and vascularized human cardiac muscle tissue," PNAS 106(39):16568-16573.
Tan, W. et al. (2004) "Bionanotechnology based on Silica Nanoparticles," Medicinal Research Reviews 24(5):621-638.
Taylor, D. et al. (2010) "Shrink film patterning by craft cutter: complete plastic chips with high resolution/high-aspect ratio channel," Lab Chip 10:2472-2475.
Tessier, D.C. et al. (2006) "Improved surface sensing of DNA on gas-etched porous silicon," Sensors and Actuators B 120:220-230.
Thomson, J.A. et al. (1998) "Embryonic Stem Cell Lines Derived from Human Blastocysts," Science 282:1145-1147.
Van Der Meer, A.D. et al. (2010) "Analyzing shear stress-induced alignment of actin filaments in endothelial cells with a microfluidic assay," Biomicrofluidics 4:11103(1-5).
Volle, J-N. et al. (2003) "Enhanced sensitivity detection of protein immobilization by fluorescent interference on oxidized silicon," Biosensors and Bioelectronics 19:457-464.
Watt, F.M. et al. (1988) "Cell shape controls terminal differentiation of human epidermal keratinocytes," PNAS 85:5576-5580.
Xu, C. et al. (2001) "Feeder-free growth of undifferentiated human embryonic stem cells," Nature Biotechnology 19:971-974.
Xue, T. et al. (2005) "Functional Integration of Electrically Active Cardiac Derivatives From Genetically Engineered Human Embryonic Stem Cells With Quiescent Recipient Ventricular Cardiomyocytes: Insights Into the Development of Cell-Based Pacemakers," Circulation 111:11-20.
Yang, L. et al. (2008) "Human cardiovascular progenitor cells develop from a KDR+ embryonic-stem-cell-derived population," Nature 453:524-529.
Yim, E.K.F. et al. (2010) "Nanotopography-induced changes in focal adhesions, cytoskeletal organization, and mechanical properties of human mesenchymal stem cells," Biomaterials 31:1299-1306.
Zheng, S. et al. (2007) "Silica Colloidal Crystals for Enhanced Fluorescence Detection in Microarrays," Analytical Chemistry 79(10):3867-3872.
Restriction Requirement for U.S. Appl. No. 13/367,317, mailed Apr. 19, 2013, 7 pages.
Non-Final Office Action for U.S. Appl. No. 13/367,317, mailed Jul. 22, 2013, 8 pages.
Final Office Action for U.S. Appl. No. 13/367,317, mailed Jan. 21, 2014, 8 pages.
Notice of Allowance for U.S. Appl. No. 13/367,317, mailed Apr. 24, 2014, 10 pages.
Notice of Allowance for U.S. Appl. No. 13/367,317, mailed Jul. 2, 2014, 9 pages.
Non-Final Office Action for U.S. Appl. No. 13/367,320, mailed Aug. 3, 2012, 11 pages.
Final Office Action for U.S. Appl. No. 13/367,320, mailed Feb. 22, 2013, 15 pages.
Non-Final Office Action for U.S. Appl. No. 13/367,320, mailed Oct. 27, 2014, 14 pages.
Restriction Requirement for U.S. Appl. No. 13/891,104, mailed Jan. 15, 2015, 9 pages.
Non-Final Office Action for U.S. Appl. No. 13/891,104, mailed Apr. 13, 2015, 10 pages.
Non-Final Office Action for U.S. Appl. No. 13/367,317, mailed Aug. 14, 2013, 7 pages.
Final Office Action for U.S. Appl. No. 13/367,320, mailed Jun. 19, 2015, 20 pages.
U.S. Appl. No. 13/654,275, filed Oct. 17, 2012, Khine et al.
Non-Final Office Action in U.S. Appl. No. 13/367,320, mailed Mar. 18, 2016.
Non-Final Office Action in U.S. Appl. No. 13/654,275, mailed Dec. 17, 2013.
Notice of Allowance in U.S. Appl. No. 13/654,275, mailed Nov. 24, 2014.
Notice of Allowance in U.S. Appl. No. 13/654,275, mailed Oct. 7, 2015.
Restriction Requirement in U.S. Appl. No. 13/891,104, mailed Jan. 15, 2015.
Final Office Action in U.S. Appl. No. 13/891,104, mailed Dec. 21, 2015.
Notice of Allowance in U.S. Appl. No. 13/654,275, mailed Jun. 10, 2016.
Non-Final Office Action in U.S. Appl. No. 13/891,104, mailed Jul. 8, 2016.
US Office Action dated Jan. 4, 2017, from U.S. Appl. No. 13/367,320.

\* cited by examiner

PHOTOLITHOGRAPHY ON SHRINK FILM

CROSS-REFERENCE TO RELATED APPLICATION

This application claims the benefit under 35 U.S.C. §119 (e) of U.S. Provisional Ser. No. 61/491,127, filed May 27, 2011, the content of which is incorporated by reference in its entirety into the present disclosure.

FIELD OF THE INVENTION

The invention disclosed herein related to the field of microfabrication.

BACKGROUND

Microfabrication techniques were originally developed for the microelectronic industry, researchers have been able to create simple designs such as well-defined and repetitive patterns of grooves, ridges, pits, and waves. Techniques such as photolithography, electron-beam lithography, colloidal lithography, electrospinning, and nanoimprinting are popular methods for fabricating micro and nano topographical features. The need for large capital investments and engineering expertise has prevented the widespread use of these fabrication methods in common biological laboratories.

Continual miniaturization of optical and optoelectronic devices drives the need for increasingly low cost, smaller form factor, and monolithic integration of versatile components such as microlens arrays (MLAs). Conventional micromachining to fabricate MLAs is limited in its scalability, with large area production becoming prohibitively expensive. As such, there is a corresponding interest in moving from glass to polymer MLAs. Many methods to fabricate MLAs in polymers have been demonstrated, and include such innovative techniques as photoresist reflow, laser ablation, and molding UV photocurable polymers from elastomer molds. Thermal photoresist reflow leverages surface tension to create hemispherical shaped lenses from melted micropatterned photoresist. While this is a pervasive method to create optical molds, this approach has a limited geometry that requires a certain thickness of photoresist. When the deposited photoresist thickness is too thin, significant deviations from a rounded shape ensues; therefore lenses with NA (numerical aperture)<0.15 are not possible. Laser ablation, for example with an excimer laser, can be used to create lenses in plastics such as polycarbonate. While this is an attractive direct write process, it is a slow serial process that requires precision instrumentation. On the other extreme, molding epoxies from elastomer molds such as polydimethylsiloxane (PDMS) allows for low cost replicate molding, but still needs creation of the original master.

Therefore, the ability to create large arrays of low cost microlens in a plastic substrate from scratch with acceptable optical properties remains a challenge. Photoresist, for example, has a relatively large absorption and is therefore not ideal for many applications. Transferring such features into optical grade plastic requires processes such as hot embossing, which necessitates both an electrode position process to create the metallic mold as well as expensive capital embossing equipment; this approach is therefore not amenable to prototyping and/or low volume production.

SUMMARY

On embodiment of the present disclosure provides a method for preparing a plurality of extrusions, comprising (a) shrinking a transparent first thermoplastic material comprising a plurality of marks, (b) lithographically transferring the pattern of the shrunk non-transparent marks to a layer of photoresist deposited on a second thermoplastic material, and (c) shrinking the second thermoplastic material, thereby generating a plurality of extrusions formed by the photoresisit on the shrunk second thermoplastic material. In some aspects, the marks are non-transparent.

In one aspect, the first and/or the second thermoplastic material is pre-stressed prior to being shrunk and the shrinking comprises removing the stress.

In one aspect, the shrinking of (a) and/or (c) comprises heating the material. In another aspect, the shrinking of (a) and/or (c) is uniaxial or biaxial. In some aspects, the first thermoplastic material is shrunk by at least 60%. In yet another aspect, the second thermoplastic material is shrunk by at least 60%.

In one aspect, the marks are of a round shape or an oval shape.

In one aspect, the extrusions are smaller than about 5% of the marks in diameter. In another aspect, the extrusions are smaller than about 1% of the marks in diameter.

The first and/or second thermoplastic material can comprise a high molecular weight polymer, polyolefin, polyethylene, a shape memory polymer, acrylonitrile butadiene styrene (ABS), acrylic, celluloid, cellulose acetate, ethylene-vinyl acetate (EVA), ethylene vinyl alcohol (EVAL), fluoroplastics (PTFEs, including FEP, PFA, CTFE, ECTFE, ETFE), ionomers kydex, a trademarked acrylic/PVC alloy, liquid crystal polymer (LCP), polyacetal (POM or Acetal), polyacrylates (Acrylic), polyacrylonitrile (PAN or Acrylonitrile), polyamide (PA or Nylon), polyamide-imide (PAI), polyaryletherketone (PAEK or Ketone), polybutadiene (PBD), polybutylene (PB), polybutylene terephthalate (PBT), polyethylene terephthalate (PET), Polycyclohexylene Dimethylene Terephthalate (PCT), polycarbonate (PC), polyhydroxyalkanoates (PHAs), polyketone (PK), polyester polyethylene (PE), polyetheretherketone (PEEK), polyetherimide (PEI), polyethersulfone (PES), polysulfone polyethylenechlorinates (PEC), polyimide (PI), polylactic acid (PLA), polymethylpentene (PMP), polyphenylene oxide (PPO), polyphenylene sulfide (PPS), polyphthalamide (PPA), polypropylene (PP), polystyrene (PS), polysulfone (PSU), polyvinyl chloride (PVC), polyvinylidene chloride (PVDC) or spectralon.

Also provide is a scaffold comprising a plurality of extrusions prepared by the method of the present disclosure.

BRIEF DESCRIPTION OF THE DRAWINGS

The figures of the accompanying drawings describe provided embodiments by way of illustration only, in which:

FIG. 1a-f illustrates the process flow of in Example 1: a) Pattern was printed on PS sheet with laser printer; b) PS sheet was shrunk with heat gun; c) PS sheet was used as a mask to transfer pattern to photoresist spun onto a PO sheet; d) PO was shrunk in oven; e) PO was molded with PDMS; f) COC was clamped to the PDMS mold, thus conforming to it when heated, producing a MLA;

FIG. 2a-c show images of PS mask and PO mold: a) Macro image of preshrunk and shrunk PS mask; left inset ink spots on preshrunk PS; right inset ink spots on shrunk PS; Scale bar=500 μm; b) Photoresist spots on preshrunk PO. Scale bar=200 μm. c) Photoresist spots on shrunk PO. Scale bar=200 μm;

FIG. 4a-e show COC MLA focus spots evaluation: a) Microscope image of lens; b) Image of focus spots; c) Profiles of intensity of five sample focus spots along the x axis; d) Along the y axis; e) Table with beam width and numerical aperture data. Scale bar=200 µm.

Some or all of the figures are schematic representations for exemplification; hence, they do not necessarily depict the actual relative sizes or locations of the elements shown. The figures are presented for the purpose of illustrating one or more embodiments with the explicit understanding that they will not be used to limit the scope or the meaning of the claims that follow below.

DETAILED DESCRIPTION

Definitions

As used herein, certain terms may have the following defined meanings

As used in the specification and claims, the singular form "a," "an" and "the" include plural references unless the context clearly dictates otherwise.

As used herein, the term "comprising" is intended to mean that the compositions and methods include the recited elements, but do not exclude others. "Consisting essentially of" when used to define compositions and methods, shall mean excluding other elements of any essential significance to the combination when used for the intended purpose. Thus, a composition consisting essentially of the elements as defined herein would not exclude trace contaminants or inert carriers. "Consisting of" shall mean excluding more than trace elements of other ingredients and substantial method steps for preparing the intended device. Embodiments defined by each of these transition terms are within the scope of this invention.

All numerical designations, e.g., pH, temperature, time, concentration, and molecular weight, including ranges, are approximations which are varied (+) or (−) by increments of 0.1. It is to be understood, although not always explicitly stated that all numerical designations are preceded by the term "about". It also is to be understood, although not always explicitly stated, that the reagents described herein are merely exemplary and that equivalents of such are known in the art.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above.

A "thermoplastic material" is intended to mean a plastic material which shrinks upon heating or upon release of prestress such as a stress created by stretching. In one aspect, the thermoplastic materials are those which shrink uniformly without distortion. The shrinking can be either bi-axially (isotropic) or uni-axial (anisotropic). Suitable thermoplastic materials for inclusion in the methods of this invention include, for example, a shape memory polymer, polyolefin, polyethylene, high molecular weight polymers such as acrylonitrile butadiene styrene (ABS), acrylic, celluloid, cellulose acetate, ethylene-vinyl acetate (EVA), ethylene vinyl alcohol (EVAL), fluoroplastics (PTFEs, including FEP, PFA, CTFE, ECTFE, ETFE), ionomers kydex, a trademarked acrylic/PVC alloy, liquid crystal polymer (LCP), polyacetal (POM or Acetal), polyacrylates (Acrylic), polyacrylonitrile (PAN or Acrylonitrile), polyamide (PA or Nylon), polyamide-imide (PAI), polyaryletherketone (PAEK or Ketone), polybutadiene (PBD), polybutylene (PB), polybutylene terephthalate (PBT), polyethylene terephthalate (PET), Polycyclohexylene Dimethylene Terephthalate (PCT), polycarbonate (PC), polyhydroxyalkanoates (PHAs), polyketone (PK), polyester polyethylene (PE), polyetheretherketone (PEEK), polyetherimide (PEI), polyethersulfone (PES), polysulfone polyethylenechlorinates (PEC), polyimide (PI), polylactic acid (PLA), polymethylpentene (PMP), polyphenylene oxide (PPO), polyphenylene sulfide (PPS), polyphthalamide (PPA), polypropylene (PP), polystyrene (PS), polysulfone (PSU), polyvinyl chloride (PVC), polyvinylidene chloride (PVDC) and spectralon.

In some aspects, the thermoplastic material encompasses polyolefin. A polyolefin is a polymer produced from a simple olefin (also called an alkene) as a monomer. For example, polyethylene is the polyolefin produced by polymerizing the olefin ethylene. Polypropylene is another common polyolefin which is made from the olefin propylene.

In some aspects, the thermoplastic material encompasses shape memory polymers (SMPs). SMPs are polymeric smart materials that have the ability to return from a deformed state (temporary shape) to their original (permanent) shape induced by an external stimulus (trigger), such as temperature change.

Commercially available thermoplastic materials include, without limitation, "Shrinky-Dink" and Solupore®. Shrinky-Dink is a commercial thermoplastic which is used a children's toy. Solupore® is available from Lydall, Inc. of Manchester, Conn.

Methods for Generating a Nano-Scale Pattern

One embodiment of the present disclosure provides a method for preparing a plurality of extrusions, comprising (a) shrinking a transparent first thermoplastic material comprising a plurality of marks, (b) lithographically transferring the pattern of the shrunk non-transparent marks to a layer of photoresist deposited on a second thermoplastic material, and (c) shrinking the second thermoplastic material, thereby generating a plurality of extrusions formed by the photoresisit on the shrunk second thermoplastic material.

In one aspect, the marks are non-transparent. As used herein, "transparent" and "non-transparent" are relative terms. In one aspect, they refer to that the first thermoplastic material allows light to pass more easily than the marks do, so that the first thermoplastic material and the marks, together, serve as an effective photomask to transfer the pattern formed by the marks to the photoresist.

In one aspect, the marks are of a round shape or an oval shape, but they can also take other shapes as well depending on the desired shape of the extrusions. Such marks can be deposited to the transparent thermoplastic material by methods known in the art, such as laser or inkjet printing. When printing is used, the shapes of the marks can be designed on a computer, using as program such as AutoCAD®, Microsoft® PowerPoint®, or Abode® Photoshop®.

The thermoplastic material can pre-stressed prior to the shrinking treatment. In such a case, the shrinking can be achieved by removing the stress. Such a stress can simply be stretching, either uniaxially or biaxially.

Alternatively, the shrinking can be achieved by heating the material. Depending on the material and desired scale of texture, the temperature can vary. In one aspect, the heating is at least about 200° F., or at least about 250° F., or at least about 275° F., or at least about 300° F., or at least about 350° F.

Shrinking of the first material can be uniaxial or biaxial. When the material is shrunk uniaxially, the texture may be one dimensional. When the material is shrunk biaxially, the texture may be two dimensional.

In some embodiments, the first material is shrunk, uniaxially or biaxially, by at least about 60%, or alternatively at least about 70%, about 75%, about 80%, about 85%, about 90%, about 91%, about 92%, about 93%, about 94%, about 95%, about 96%, about 97%, about 98%, or about 99% from its original size.

When the transparent first thermoplastic material is shrunk, the marks also shrink along with the thermoplastic material. In some embodiments, the marks on the pre-shrink thermoplastic material is reduced in size by at least about 5 folds, or about 6, or about 7, or about 8, or about 9, or about 10, or about 12, or about 14, or about 16, or about 18, or about 20, or about 25, or about 30, or about 40, or about 50, or about 60, or about 70, or about 80, or about 90, or about 100 or about 200 folds.

The shrunk marks, along with the transparent first thermoplastic material, can then be used as photomask for photolithography, to transfer the pattern of the marks to a layer of photoresist. Methods of photolithography are known in the art. For instance, a UV light is transmitted through the photomark onto the photoresist. Areas of the photoresist covered and thus protected by the marks are retained whereas areas exposed to the light are removed.

Upon photolithography, the photoresist adopts the pattern of the shrunk marks. As the photoresist is deposited on a second thermoplastic material, the photoresist can undergo shrinking when the second thermoplastic material is shrunk. As such, the size of the pattern is further reduced.

The second thermoplastic material can pre-stressed prior to the shrinking treatment. In such a case, the shrinking can be achieved by removing the stress. Such a stress can simply be stretching, either uniaxially or biaxially.

Alternatively, the shrinking can be achieved by heating the second material. Depending on the material and desired scale of texture, the temperature can vary. In one aspect, the heating is at least about 200° F., or at least about 250° F., or at least about 275° F., or at least about 300° F., or at least about 350° F.

Shrinking of the second material can be uniaxial or biaxial. When the material is shrunk uniaxially, the texture may be one dimensional. When the material is shrunk biaxially, the texture may be two dimensional.

In some embodiments, the second material is shrunk, uniaxially or biaxially, by at least about 60%, or alternatively at least about 70%, about 75%, about 80%, about 85%, about 90%, about 91%, about 92%, about 93%, about 94%, about 95%, about 96%, about 97%, about 98%, or about 99% from its original size.

By virtue of the second shrinking, the photoresist forms a plurality of extrusions on the second thermoplastic material. Compared to the original size of the marks, the size of the extrusions are significantly smaller. In one aspect, the extrusions have a diameter that is less than about 5% of that of the original marks. Alternatively, the extrusions have a diameter that is less than about 4%, 3%, 2%, 1%, 0.5%, 0.2%, 0.1%, 0.05% or 0.01% of that of the original marks.

Also, due to the shrinking, the extrusions have a height that is higher than the sickness of the photoresist before shrinking In some aspects, the extrusions have a shape of a dome or semi-sphere. In one aspect, an extrusion has a height that is at least about ⅓ of the diameter of their projected area on the second thermoplastic material. In another aspect, the extrusion has a height that is at least about ½, ¾, 100%, 125%, 150%, 175% 200%, 250%, or 300% of the diameter of its projected area on the second thermoplastic material Methods of Using the Nano-Scale Pattern to Prepare Microlenses The extrusions prepared by the methods as described above can be used to make a mode which can then be used to prepare nano-scale devices, such as microlens arrays. In one aspect, for instance, the extrusions on the second thermoplastic material are used to generate a PDMS mode. Subsequently, the PDMS mode can be used to produce one or more microlens arrays.

The use of the extrusions is not limited to preparing microlens. Another exemplary use is to make microwells for cell culture. In both of these cases, the marks deposited on the first thermoplastic material are of round or oval shapes. When the original marks are lines, for instance, and in particular when both shrinking are uniaxial, the extrusions are even narrower lines, which can be used to generate microchannels.

EXAMPLE 1

This example demonstrates integrating photolithography with the shrink process of patterning at a larger scale and then shrinking to create rounded, high aspect ratio structures. In addition to demonstrating the compatibility of this process with photolithography, the method shown in this example obviates the need for an expensive chrome mask and a clean room altogether. Moreover, this is the first demonstration of using a 'Shrinky-Dink' mask printed with a standard laser jet printer. Taken together, this sequential shrink provides a complete process to create features, with a 99% reduction in area from the original pattern size. This approach also suggests that a more elaborate master-slave sequences with additional sequential size reductions, is possible.

Figure 1:
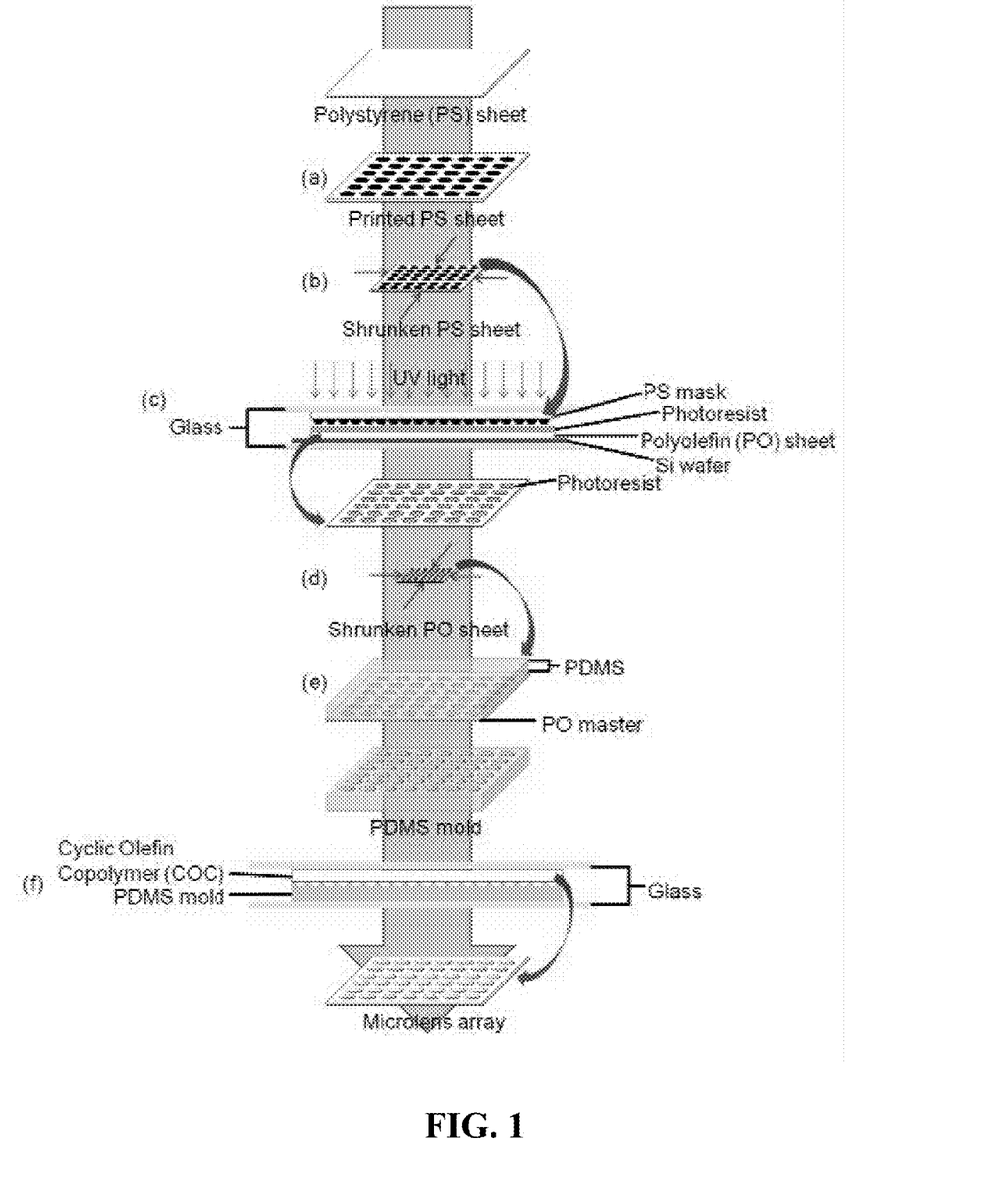

First, a mask is created by using a standard desktop laser-jet printer on a polystyrene sheet known as the children's toy Shrinky Dink (K & B Innovations). Then, using this resultant 'Shrinky Dink' mask and a homemade UV flood light, positive photoresist is cross-linked on another shrink film. This allows to rapidly achieve 2 sequential shrinks, with the first mask shrinking by approximately 60% in surface area and the second 'wafer-substrate' shrinking an additional 95% in surface area (FIG. 1).

This second wafer-substrate coated with photoresist is a polyolefin (PO) (D955, 1.5 mil, Sealed Air), available as commodity shrink-wrap film. The resultant small and smooth microarray lens arrays (MLA) that can be either used directly as lenses or subsequently molded into polymers or other plastics, including the optically attractive cyclic olefin copolymer (COC). COC is an attractive plastic because it has higher optical transmission (>90%) than the plastics commonly used for microlenses, such as polymethylmethacrylate (PMMA) or polystyrene (PS). COC is available in sheets (Topas® 8007D-61, 8 mil, Advanced Polymer) that are easy to emboss with PDMS masters.

While soft lithography has been used to create MLAs as well as to serve as molds for epoxies, this example demonstrates that they can be used to emboss the MLA into a hard plastic, to yield high fidelity lenses in COC.

Figure 2:
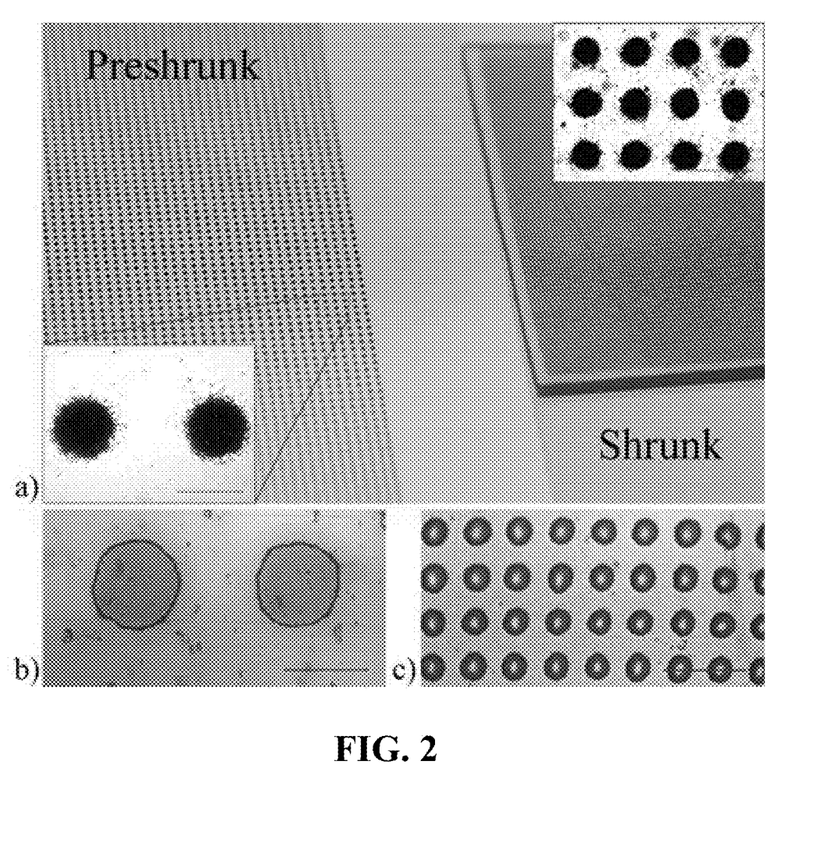

The dot pattern created in AutoCAD was printed via laser jet printer (Hewlett Packard CP2025) onto a Shrinky Dink polystyrene sheet (FIG. 2a). When heated briefly with a heat gun (Steinel HL 1810 S), the toner ink coalesces and becomes thicker, blocking out the UV light, and serving as an effective mask for positive photoresist (FIG. 2b). The positive photoresist (Shipley, 1808) was spin coated onto the PO for 45 seconds (s) at 4000 rpm to create a 1 μm thick film. For the soft bake, the wafer was heated for 1 minute (min) at 115° C. on a hot plate. Using the aforementioned mask, the photoresist was exposed for 20 s with a UV flood lamp and developed (Microposit MF-321). The PO was shrunk in an oven beginning at 115° C. The temperature was held there for 5 min before ramping to 135° C. Again, the temperature was held for 5 min before being ramped to 155° C. The photoresist was then reflowed by heating on a hot plate set at 150° C. for 15 min and then slowly cooling on the hot plate, roughly 10° C./min. A PDMS mold was made from the shrunk photoresist pattern. COC plastic was molded into lenses by constraining them against the PDMS mold with a glass slide (75 mm×75 mm, Fisher) sandwich and heating at 160° C. for 10 min in an oven. Lenses of various sizes can thus be fabricated by varying the pattern and the photoresist thickness.

Figure 3:
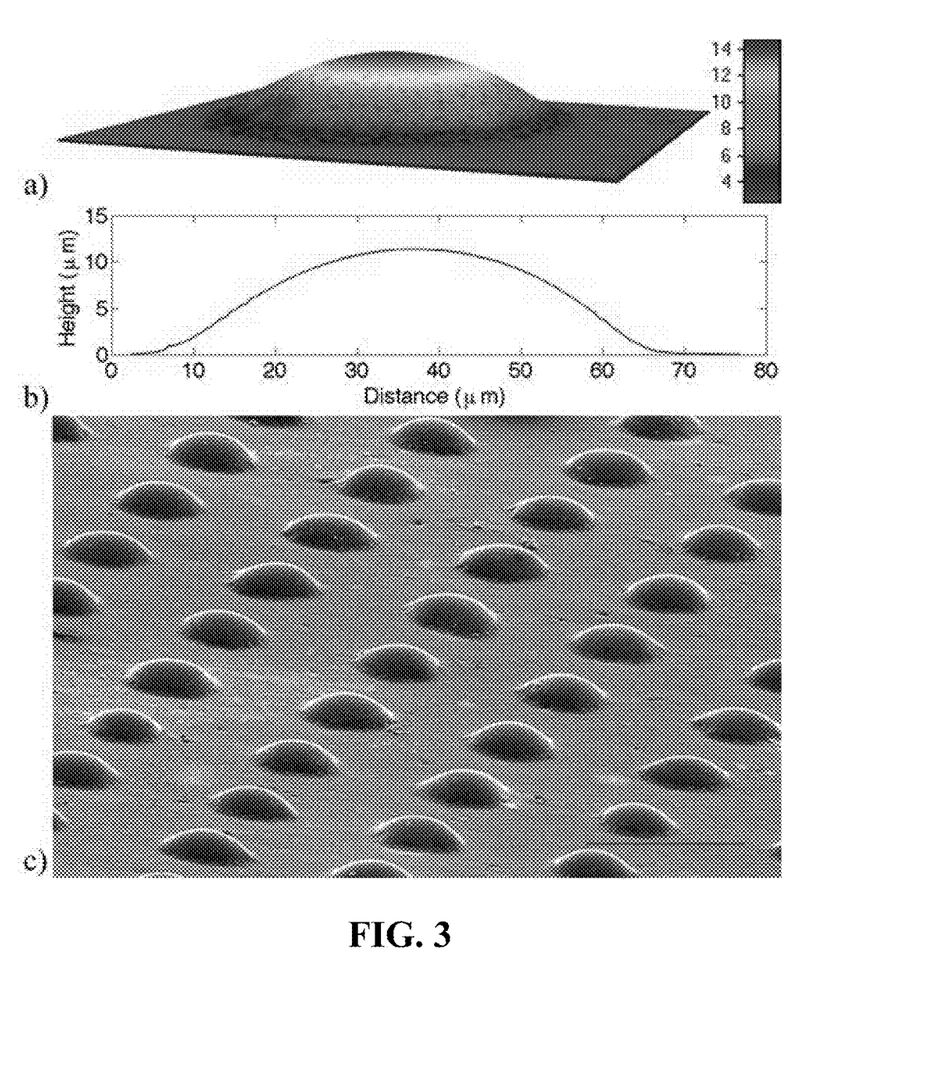
FIG. 3a is a 3D image of lens mold by optical profilometer.
FIG. 3b is an example of microlens mold profile.
FIG. 3c is a SEM image of microlens. Scale bar=100 µm.

The lenses were characterized by scanning electron micrograph (SEM) (FIG. 3a), optical profilometer (FIG. 3b), and atomic force microscopy (AFM). Interestingly, the RMS roughness of our lenses as determined by AFM of ~14 nm over a 100 μm$^2$ is better than even optical molds created by high precision serial processes such as diamond turning. If one considers the visible spectrum from 350 nm to 750 nm, the measured roughness is only ⅟₂₈ to ⅟₅₄ of the focused wavelength and should contribute little to wave front distortion or scatter. For this lens, the focal length was determined to be 74 μm.

Figure 4:
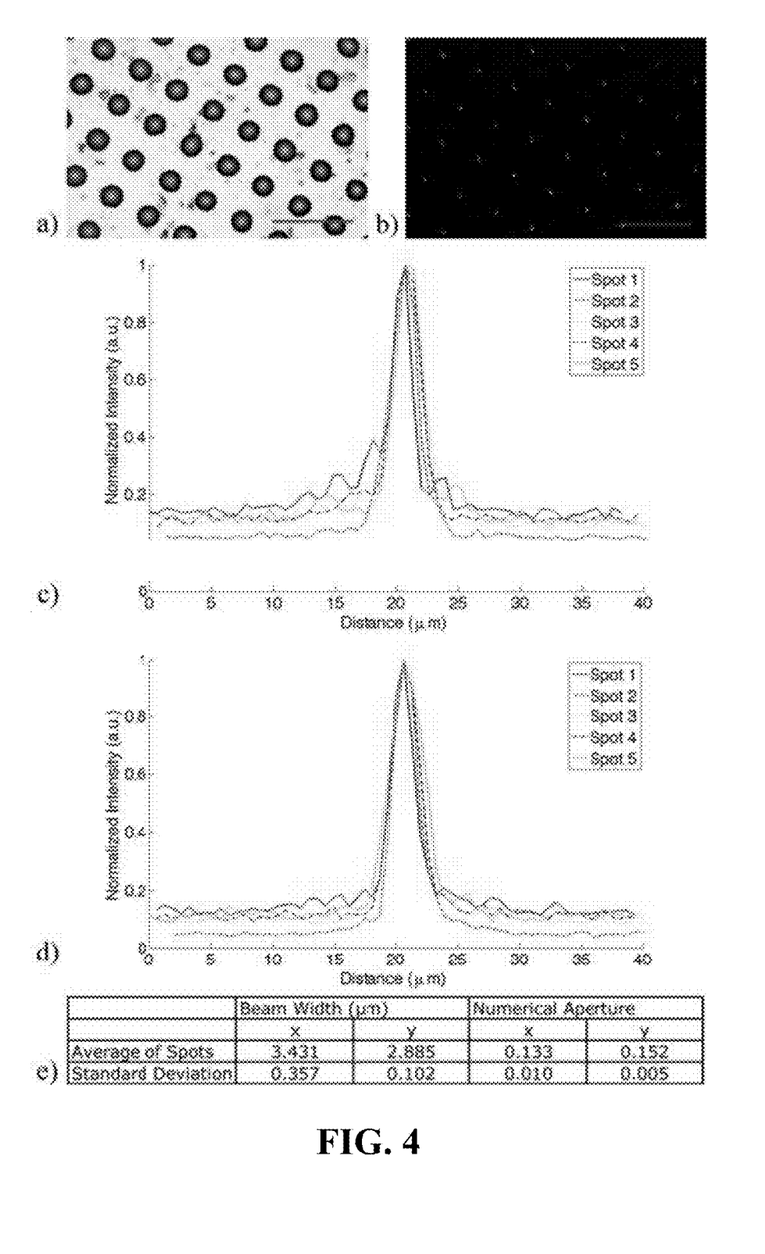

To determine the functionality of the MLA, we determined the full width half max (FWHM) of the focus spots in two perpendicular directions (in both the x and y) of several lenses (FIG. 4a) out of the array. To do this the MLA was used to focus light from a 660 nm laser onto a microscope objective. Image stacks were captured by scanning the microscope objective along the optical axis through the focal plane of the MLA in 10 um steps. Images were analyzed by custom software coded in MATLAB.

Z-stacked images (step size=10 μm) of the focal spots were imaged onto the camera (Hammatsu Orca) using the microscope objective (10×) (FIG. 4b). The in-focus image plane was selected visually and the image segmented in MATLAB. The brightest pixel in each individual focal spot was selected for analysis. FIG. 4c and d show the intensity profile along the x and y directions respectively. This was done because there are slight variations in the percentage shrinkage in the x and y directions. As a result, both the long axis and short axis of the lenses were measured and it was found that for the 70 μm MLA, the average x diameter was 70.8+2.1 μm and the average y was 64.9+2.6 μm (n=20). This was most likely due to the non-uniform shrinking of the PO substrate. Finally, the FWHM was calculated as the width of the intensity profile at Normalized Intensity=0.5.

In summary, this example demonstrated for the first time the compatibility of standard photolithography with shrink film size reduction to achieve 99% reduction in area from original pattern size. Using this approach and a sequential shrinking, it achieved a MLA in the optical grade plastic COC. While there are slight variations in the MLA, in part because this example used a Shrinky Dink mask and in part due to the imperfections of the commodity shrink wrap film, this demonstration of such an approach opens the potential of shrinking photoresist to beat the inherent limit of resolution of 'top-down' fabrication approaches.

While the present invention is exemplified and illustrated by the use of polystyrene sheets to fabricate channel structures and molds, it would be obvious to those of skill in the art that any thermoplastic receptive material that can be patterned to control the dimensions of the channel defining walls and thereby their size, can be used to fabricate the devices disclosed and claimed herein. In addition, although several other embodiments of the invention are described herein in detail, it will be understood by those skilled in the art that variations may be made thereto without departing from the spirit of the invention or the scope of the appended claims.

What is claimed is:

1. A method for preparing a plurality of extrusions, comprising (a) shrinking a transparent first thermoplastic material comprising a plurality of non-transparent marks, (b) lithographically transferring the pattern of the shrunk non-transparent marks to a layer of photoresist deposited on a second thermoplastic material, and (c) shrinking the second thermoplastic material, thereby generating a plurality of extrusions on the shrunk second thermoplastic material, wherein the second thermoplastic material shrinks by at least about 70% from its original size.

2. The method of claim 1, wherein the first and/or the second thermoplastic material is pre-stressed prior to being shrunk and the shrinking comprises removing the stress.

3. The method of claim 1, wherein the shrinking of (a) and/or (c) comprises heating the material.

4. The method of claim 1, wherein the shrinking of (a) and/or (c) is uniaxial or biaxial.

5. The method of claim 1, wherein the first thermoplastic material is shrunk by at least 60%.

6. The method of claim 1, wherein the second thermoplastic material is shrunk by at least 60%.

7. The method of claim 1, wherein the marks are of a round shape or an oval shape.

8. The method of claim 7, wherein the marks have a round shape and a diameter and the extrusions are smaller than about 5% of the diameter of the marks.

9. The method of claim 7, wherein the marks have a round shape and a diameter and the extrusions are smaller than about 1% of the diameter of the marks.

10. The method of claim 1, wherein the first and/or second thermoplastic material comprises a high molecular weight polymer, polyolefin, a shape memory polymer, acrylonitrile butadiene styrene (ABS), acrylic, celluloid, cellulose acetate,ethylene-vinyl acetate (EVA), ethylene vinyl alcohol (EVAL), fluoroplastics (PTFEs, including FEP, PFA, CTFE, ECTFE, ETFE), ionomers kydex, a trademarked acrylic/PVC alloy, liquid crystal polymer (LCP), polyacetal (POM or Acetal), polyacrylates (Acrylic), polyacrylonitrile (PAN or Acrylonitrile), polyamide (PA or Nylon), polyamide-imide (PAI), polyaryletherketone (PAEK or Ketone), polybutadiene (PBD), polybutylene (PB), polybutylene terephthalate (PBT), polyethylene terephthalate (PET), Polycyclohexylene Dimethylene Terephthalate (PCT), polycarbonate (PC), polyhydroxyalkanoates (PHAs), polyketone (PK), polyester, polyethylene (PE), polyetheretherketone (PEEK), polyetherimide (PEI), polyethersulfone (PES), polysulfone polyethylenechlorinates (PEC), polyimide (PI), polylactic acid (PLA), polymethylpentene (PMP), polyphenylene oxide (PPO), polyphenylene sulfide (PPS), polyphthalamide (PPA), polypropylene (PP), polystyrene (PS), polysulfone (PSU), polyvinyl chloride (PVC), polyvinylidene chloride (PVDC) or spectralon.

* * * * *